(12) United States Patent
Raad et al.

(10) Patent No.: US 10,665,292 B1
(45) Date of Patent: May 26, 2020

(54) SENSING TECHNIQUES USING CHARGE TRANSFER DEVICE

(71) Applicant: Micron Technology, Inc., Boise, ID (US)

(72) Inventors: George B. Raad, Boise, ID (US); John F. Schreck, Lucas, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/232,303

(22) Filed: Dec. 26, 2018

(51) Int. Cl.
  *G11C 7/22* (2006.01)
  *G11C 11/4091* (2006.01)
  *G11C 11/56* (2006.01)
  *G11C 11/408* (2006.01)
  *G11C 11/404* (2006.01)

(52) U.S. Cl.
  CPC ........ *G11C 11/4091* (2013.01); *G11C 11/404* (2013.01); *G11C 11/4087* (2013.01); *G11C 11/565* (2013.01)

(58) Field of Classification Search
  CPC . G11C 11/4091; G11C 11/565; G11C 11/404; G11C 11/4087
  USPC .................................................. 365/189.011
  See application file for complete search history.

(56) References Cited

U.S. PATENT DOCUMENTS

| | | | | |
|---|---|---|---|---|
| 6,198,677 | B1* | 3/2001 | Hsu .......................... | G11C 7/06 365/203 |
| 2004/0004881 | A1* | 1/2004 | Sahoo .................... | G11C 7/067 365/208 |
| 2006/0133133 | A1* | 6/2006 | Yamada ................... | G11C 7/08 365/149 |
| 2008/0025113 | A1* | 1/2008 | Kitagawa ............... | G11C 7/067 365/189.09 |

* cited by examiner

*Primary Examiner* — Tha-O H Bui
(74) *Attorney, Agent, or Firm* — Holland & Hart LLP

(57) ABSTRACT

Devices and methods for sensing a memory cell using a charge transfer device are described. In some examples, the charge transfer device may be coupled with an input transistor of a differential transistor pair that may be coupled with a sense component. The differential transistor pair may be configured to isolate the sense component from the charge transfer device during a read operation. To read the memory cell, a gate of the charge transfer device may be charged to a first voltage. Subsequently, a digit line may be biased to a second voltage by discharging the memory cell onto the digit line. A charge may be transferred, using the charge transfer device, between the digit line and a gate of the input transistor such that the sense component may determine a logic state stored on the memory cell based on the first voltage and the second voltage.

25 Claims, 7 Drawing Sheets

SENSING TECHNIQUES USING CHARGE TRANSFER DEVICE

BACKGROUND

The following relates generally to operating a memory device and more specifically to sensing techniques using a charge transfer device.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the electronic device may read, or sense, at least one stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Volatile memory devices, e.g., DRAM, may lose their stored state over time unless they are periodically refreshed by an external power source. Non-volatile memory, e.g., FeRAM, may maintain their stored logic state for extended periods of time even in the absence of an external power source.

Improving memory devices, generally, may include increasing memory cell density, increasing read/write speeds, increasing reliability, increasing data retention, reducing power consumption, or reducing manufacturing costs, among other metrics. Some memory cells may be configured to store multiple states. Improving an efficiency (e.g., less power consumption, improved sensing accuracy) of a sensing component of memory devices may also be desired.

DETAILED DESCRIPTION

Figure 1:
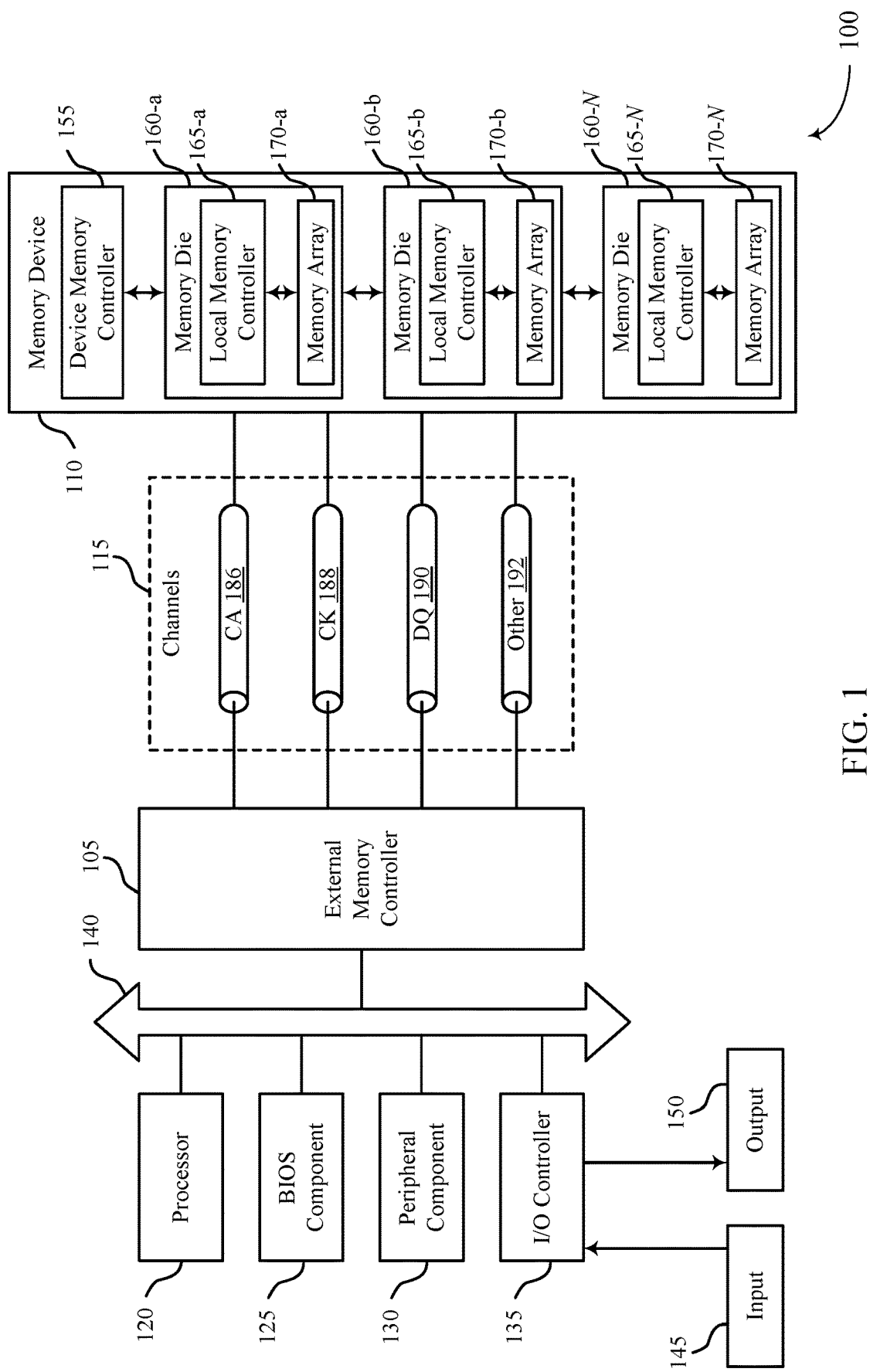
FIG. 1 illustrates an example of a system that supports sensing techniques using a charge transfer device in accordance with aspects of the present disclosure.

In some memory devices, a memory cell may be configured to store more than two states (e.g., more than one bit of digital data). Accurate sensing of the memory cell may become difficult as the memory cell scales to increase packing density or increasing number of bits per memory cell (e.g., multi-level cell). A charge transfer device may be used to increase a sense window of the memory cell during a read operation. During the read operation, a node of the charge transfer device may be precharged to a voltage, where the node is directly coupled with a sense component.

In some cases, the precharging operation may unintentionally activate the sense component due to the voltage at the node being coupled to the sense component. A sense component may be configured with transistors having relatively high threshold voltages to avoid such an unintentional activation, but performance of the sense component may be compromised due to, for example, threshold voltage mismatches among the transistors or greater power consumption. Thus, isolating a sense component from a node shared between the sense component and other components (e.g., a charge transfer device) may improve the read operation generally.

Techniques for sensing a memory cell using a charge transfer device are described, where the charge transfer device may be coupled with a sense component (e.g., either directly or indirectly) during a read operation. The techniques may, in some examples, use a differential transistor pair that may be located between the charge transfer device and the sense component (among other techniques) to avoid unintentional activation of the sense component. The sense component may include a sense node and a reference node and be configured to determine a logic state stored on a memory cell during the read operation (e.g., by comparing a voltage difference between the sense node and the reference node). The differential transistor pair may include an input transistor coupled with the sense node of the sense component and a reference transistor coupled with the reference node of the sense component. The charge transfer device may, in some cases, be coupled with a gate of the input transistor (instead of being coupled with a sense node of a sense component). In this manner, the sense node of the sense component may be isolated from the charge transfer device. Thus, when a node of the charge transfer device and the input transistor is precharged to a voltage before transferring a charge during the read operation, it may be less likely that the sense component may be unintentionally activated.

Isolating a sense component from a charge transfer device may facilitate providing a common voltage to the sense node and the reference node of the sense component to increase sensing accuracy. An equalization component may couple the sense node with the reference node to provide the common voltage. Further, the precharging operation of the charge transfer device may use different voltages (e.g., a higher voltage) during different durations of a read operation to improve a sensing window by taking advantage of the differential transistor pair isolating the sense node of the sense component from the charge transfer device operation. The techniques may also use a writing component configured to store a logic state (e.g., a logic state of 0) to a memory cell either to restore the logic state of the memory cell after a read operation or to write the logic state during a write operation or a refresh operation. The writing component may be coupled to the sense node of the sense component and the sense node may be further coupled with an input/output (I/O) device.

In some cases, during a read operation, a controller may precharge a node to a first precharge voltage, where the node is coupled with a charge transfer device (e.g., a first transistor) and a gate of an input transistor (e.g., an input transistor of a differential transistor pair). Further, a compensation device (e.g., a second transistor) coupled with a gate of the charge transfer device and the node may bias the gate of the charge transfer device to a first voltage based on precharging the node to the first precharge voltage. The first voltage may be based on a threshold voltage differential associated with the charge transfer device.

The controller may cause a memory cell to discharge onto a digit line to bias the digit line to a second voltage that may correspond to a logic state stored on the memory cell. In some cases, the controller may bias the gate of the charge transfer device to the first voltage concurrently with discharging the memory cell onto the digit line. Thereafter, the controller, using the charge transfer device, may transfer a charge between the digit line and the gate of the input transistor (e.g., the node) based on the logic state stored on the memory cell. The controller, using a sense component coupled with the input transistor, may determine the logic state stored on the memory cell based on transferring the charge between the digit line and the gate of the input transistor. Further, the controller may restore the logic state stored on the memory (e.g., writing back the original logic state to the memory cell).

Features of the disclosure are initially described in the context of a memory system. Features of the disclosure are described in the context of a memory die, a circuit diagram, and a timing diagram that support sensing techniques using a charge transfer device in accordance with aspects of the present disclosure. These and other features of the disclosure are further illustrated by and described with reference to an apparatus diagram and flowcharts that relate to sensing techniques using a charge transfer device.

FIG. 1 illustrates an example of a system 100 that utilizes one or more memory devices in accordance with aspects disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include aspects of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be a component configured to store data for one or more other components of the system 100. In some examples, the system 100 is configured for bi-directional wireless communication with other systems or devices using a base station or access point. In some examples, the system 100 is capable of machine-type communication (MTC), machine-to-machine (M2M) communication, or device-to-device (D2D) communication.

At least some portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots. The peripheral component(s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, etc. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein.

The memory device 110 may include a device memory controller 155 and one or more memory dice 160. Each memory die 160 may include a local memory controller 165 (e.g., local memory controller 165-a, local memory controller 165-b, and/or local memory controller 165-N) and a memory array 170 (e.g., memory array 170-a, memory array 170-b, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2.

In some examples, the memory device 110 or the memory die 160 may be coupled with or include one or more sense components. Each memory cell of memory array 170, for example, may be coupled with a digit line that may be further coupled with a charge transfer device (e.g., a first transistor). A gate of the charge transfer device may be coupled with a compensation device (e.g., a second transistor) and a capacitor configured to compensate for a threshold voltage differential associated with the charge transfer device. Further, the charge transfer device may be coupled with a gate of an input transistor of a differential transistor pair that is coupled with the sense component. The charge transfer device may be configured to transfer a charge between the digit line and the gate of the input transistor based on the memory cell being discharged onto the digit line. The differential transistor pair may be configured to isolate the sense component from the charge transfer device.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-a, memory die 160-b, and/or any number of memory dice 160-N). In a 3D memory device, a plurality of memory dice 160-N may be stacked on top of one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the number of memory cells that may be positioned on a substrate as compared with a single 2D memory device, which in turn may reduce production costs or increase the performance of the memory array, or both.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120.

In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

During a read operation, the local memory controller 165 (or the device memory controller 155 in conjunction with the local memory controller 165) may precharge a charge transfer device (e.g., a first transistor) and a gate of an input transistor to a first precharge voltage (e.g., 1 V). As a result of precharging the charge transfer device to the first precharge voltage, a gate of the charge transfer device may be biased to a first voltage. In some cases, the first voltage may represent a voltage that allows the charge transfer device to be variably activated (e.g., turned on) based on a voltage on the digit line during the read operation. Further, a compensation device (e.g., a second transistor) that is coupled with the gate of the charge transfer device may facilitate biasing the gate of the charge transfer device to the first voltage, where the first voltage may be based on a threshold voltage differential associated with the charge transfer device. In some cases, statistical process variations (e.g., variations in gate oxide thicknesses, fluctuations in ion-implantation conditions) may contribute to the threshold voltage differential. The local memory controller 165 may discharge a memory cell onto a digit line to bias the digit line to a second voltage, where the second voltage may correspond to a logic state stored on the memory cell.

In some cases, the local memory controller 165 (or the device memory controller 155 in conjunction with the local memory controller 165) may bias the gate of the charge transfer device to the first voltage concurrently with discharging the memory cell onto the digit line. Subsequently, the local memory controller 165 (or the device memory controller 155 in conjunction with the local memory controller 165), using the charge transfer device, may transfer a charge between the digit line and the gate of the input transistor based on the logic state stored on the memory cell. The local memory controller 165 (or the device memory controller 155 in conjunction with the local memory controller 165) may determine the logic state stored on the memory cell based on transferring the charge between the digit line and the gate of the input transistor. Further, the local memory controller 165 (or the device memory controller 155 in conjunction with the local memory controller 165) may restore the logic state stored on the memory (e.g., writing back the original logic state to the memory cell).

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel. In some cases, a pin or pad of a terminal may be part of a signal path of the channel 115.

Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data (DQ) channel 190 may be ×4 (e.g., including four signal paths), ×8 (e.g., including eight signal paths), ×16 (including sixteen signal paths), etc.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include eight or nine signal paths.

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential output (e.g., a CK_t signal and a CK_c signal) and the signal paths of the CK channels 188 may be configured accordingly. In some cases, the clock signal may be single ended.

In some cases, the clock signal may be a 1.5 GHz signal. A CK channel 188 may include any number of signal paths. In some cases, the clock signal CK (e.g., a CK_t signal and a CK_c signal) may provide a timing reference for command and addressing operations for the memory device 110, or other system-wide operations for the memory device 110.

The clock signal CK may therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate (e.g., bi-directional) information to be written to the memory device 110 or information read from the memory device 110. The data channels 190 may communicate signals that may be modulated using a variety of different modulation schemes (e.g., NRZ, PAM4).

In some cases, the channels 115 may include one or more other channels 192 that may be dedicated to other purposes. These other channels 192 may include any number of signal paths.

In some cases, the other channels 192 may include one or more write clock signal (WCK) channels. While the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured to coordinate an access operation (e.g., a write operation or read operation) of the external memory controller 105 and the memory device 110. In some cases, the write clock signal may be a differential output (e.g., a WCK_t signal and a WCK_c signal) and the signal paths of the WCK channels may be configured accordingly. A WCK channel may include any number of signal paths. The data clock signal WCK may be generated by a data clock, which may include one or more hardware components (e.g., oscillators, crystals, logic gates, transistors, or the like).

In some cases, the other channels 192 may include one or more error detection code (EDC) channels. The EDC channels may be configured to communicate error detection signals, such as checksums, to improve system reliability. An EDC channel may include any number of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM4, PAM8, etc., quadrature amplitude modulation (QAM), quadrature phase shift keying (QPSK), and/or others. A multi-symbol signal or a PAM4 signal may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

Figure 2:
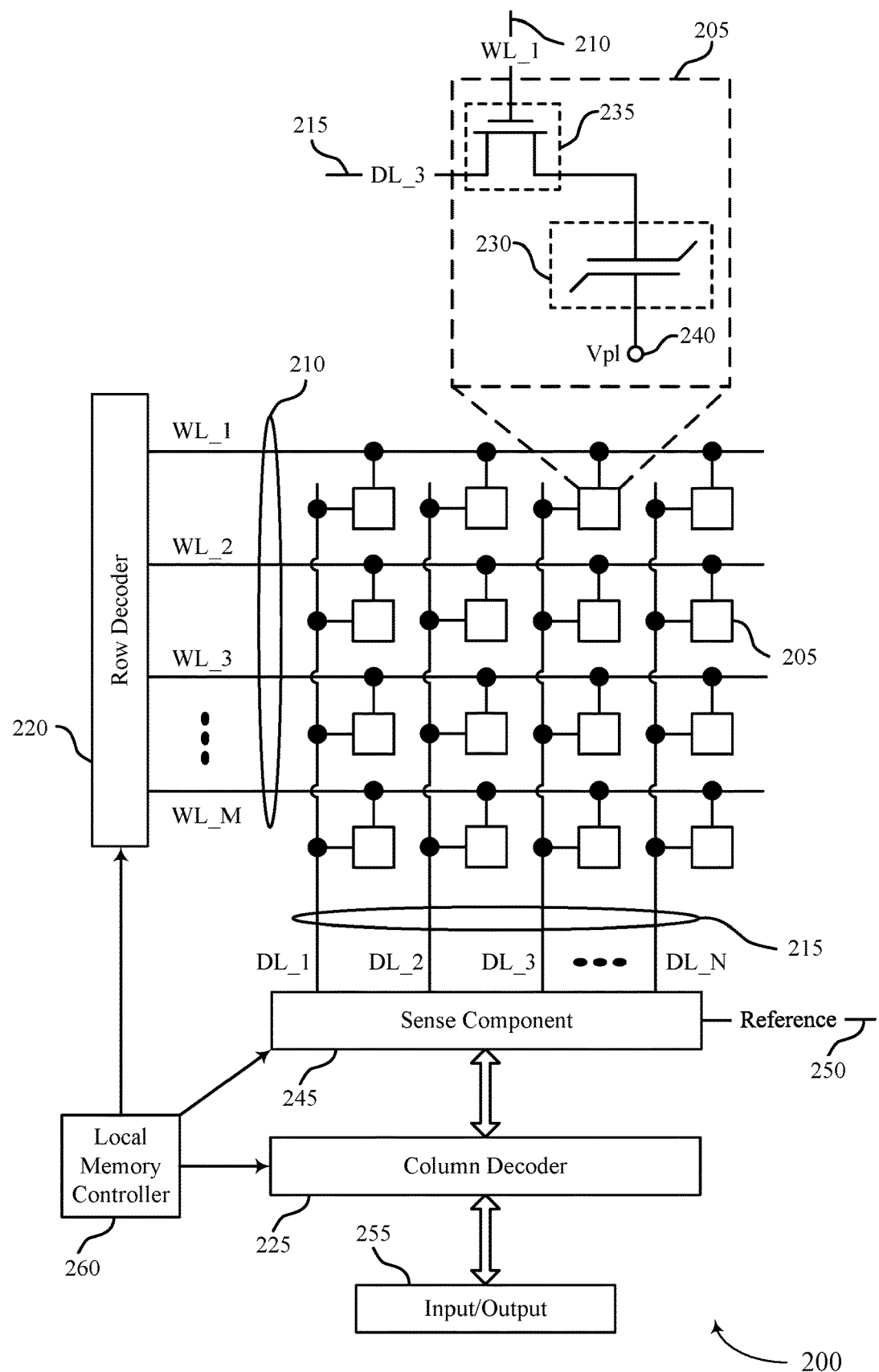
FIG. 2 illustrates an example of a memory die that supports sensing techniques using a charge transfer device in accordance with aspects of the present disclosure.

FIG. 2 illustrates an example of a memory die 200 in accordance with various examples of the present disclosure. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a charge representative of the programmable states in a capacitor. DRAM architectures may include a capacitor that includes a dielectric material to store a charge representative of the programmable state. In some examples, the memory cell 205 may be coupled with sense component 245 via digit line 215. In some examples, the digit line may include (e.g., be coupled with) a charge transfer device configured to transfer charge between the digit line and a gate of an input transistor coupled with the sense component during a read operation. The input transistor may be part of a differential transistor pair configured to isolate a sense node of the sense component from the charge transfer device during the read operation. The charge transfer device may be implemented in order to improve sensing and writing capabilities of memory cell 205 (e.g., of a multi-level memory cell configured to store three or more logic states).

Operations such as reading and writing may be performed on memory cells 205 by activating or selecting access lines such as a word line 210 and/or a digit line 215. In some cases, digit lines 215 may also be referred to as bit lines. References to access lines, word lines and digit lines, or their analogues, are interchangeable without loss of understanding or operation. Activating or selecting a word line 210 or a digit line 215 may include applying a voltage to the respective line.

The memory die 200 may include the access lines (e.g., the word lines 210 and the digit lines 215) arranged in a grid-like pattern. Memory cells 205 may be positioned at intersections of the word lines 210 and the digit lines 215.

By biasing a word line 210 and a digit line 215 (e.g., applying a voltage to the word line 210 or the digit line 215), a single memory cell 205 may be accessed at their intersection.

Accessing the memory cells 205 may be controlled through a row decoder 220 and a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address. For example, the memory die 200 may include multiple word lines 210, labeled WL_1 through WL_M, and multiple digit lines 215, labeled DL_1 through DL_N, where M and N depend on the size of the memory array. Thus, by activating a word line 210 and a digit line 215, e.g., WL_1 and DL_3, the memory cell 205 at their intersection may be accessed. The intersection of a word line 210 and a digit line 215, in either a two-dimensional or three-dimensional configuration, may be referred to as an address of a memory cell 205.

The memory cell 205 may include a logic storage component, such as capacitor 230 and a switching component 235. The capacitor 230 may be an example of a dielectric capacitor or a ferroelectric capacitor. A first node of the capacitor 230 may be coupled with the switching component 235 and a second node of the capacitor 230 may be coupled with a voltage source 240. In some cases, the voltage source 240 may be the cell plate reference voltage, such as Vpl. In some cases, the voltage source 240 may be an example of a plate line coupled with a plate line driver. The switching component 235 may be an example of a transistor or any other type of switch device that selectively establishes or de-establishes electronic communication between two components.

Selecting or deselecting the memory cell 205 may be accomplished by activating or deactivating the switching component 235. The capacitor 230 may be in electronic communication with the digit line 215 using the switching component 235. For example, the capacitor 230 may be isolated from digit line 215 when the switching component 235 is deactivated, and the capacitor 230 may be coupled with digit line 215 when the switching component 235 is activated. In some cases, the switching component 235 is a transistor and its operation may be controlled by applying a voltage to the transistor gate, where the voltage differential between the transistor gate and transistor source may be greater or less than a threshold voltage of the transistor. In some cases, the switching component 235 may be a p-type transistor or an n-type transistor. The word line 210 may be in electronic communication with the gate of the switching component 235 and may activate/deactivate the switching component 235 based on a voltage being applied to the word line 210.

A word line 210 may be a conductive line in electronic communication with a memory cell 205 that is used to perform access operations on the memory cell 205. In some architectures, the word line 210 may be in electronic communication with a gate of a switching component 235 of a memory cell 205 and may be configured to control the switching component 235 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 245. In some architectures, the memory cell 205 may be selectively coupled with the digit line 215 during portions of an access operation. For example, the word line 210 and the switching component 235 of the memory cell 205 may be configured to couple and/or isolate the capacitor 230 of the memory cell 205 and the digit line 215. In some architectures, the memory cell 205 may be in electronic communication (e.g., constant) with the digit line 215. As described herein, the digit line 215 may be coupled with a charge transfer device (e.g., a first transistor), which may be coupled with a gate of an input transistor of a differential transistor pair that is coupled with the sense component 245.

In some examples, the digit line 215 may be configured to receive charge from (e.g., to be biased by) the memory cell 205. In other words, the memory cell 205 may be discharged onto digit line 215, which may bias the digit line to a second voltage. The second voltage of the digit line may thus be representative of or related to a logic state stored in the memory cell 205. For example, if the memory cell 205 were to store a logic "0" and be discharged onto the digit line 215, the digit line 215 may be biased to a different voltage than if the memory cell 205 were to store a logic "1" and be discharged onto the digit line 215. In some examples, the charge transfer device may remain activated or become deactivated (or less conductive) based on different logic states of the memory cell 205 (hence different voltages of the digit line 215) to facilitate transferring of charge between the digit line 215 to the gate of the input transistor of the differential transistor pair.

The sense component 245 may be configured to detect a charge stored on the capacitor 230 of the memory cell 205 and determine a logic state of the memory cell 205 based on the stored charge. The charge stored by a memory cell 205 may be extremely small, in some cases. As such, the sense component 245 may include one or more sense amplifiers to amplify the signal output by the memory cell 205. The sense amplifiers may detect small changes in the charge of a digit line 215 during a read operation and may produce signals corresponding to a logic state 0 or a logic state 1 based on the detected charge. During a read operation, the capacitor 230 of memory cell 205 may output a signal (e.g., discharge a charge) to its corresponding digit line 215. The signal may cause a voltage of the digit line 215 to change.

The sense component 245 may be configured to compare the signal received from the memory cell 205 across the digit line 215 to a reference signal 250 (e.g., reference voltage). The sense component 245 may determine the stored state of the memory cell 205 based on the comparison. For example, in binary-signaling, if digit line 215 has a higher voltage than the reference signal 250, the sense component 245 may determine that the stored state of memory cell 205 is a logic 1 and, if the digit line 215 has a lower voltage than the reference signal 250, the sense component 245 may determine that the stored state of the memory cell 205 is a logic 0. The sense component 245 may include various transistors or amplifiers to detect and amplify a difference in the signals.

The detected logic state of memory cell 205 may be output through column decoder 225 as output 255. In some cases, the sense component 245 may be part of another component (e.g., a column decoder 225, a row decoder 220). In some cases, the sense component 245 may be in electronic communication with the row decoder 220 or the column decoder 225. In some examples, a sense node of the sense component 245 may, through a differential transistor pair, be indirectly coupled with a charge transfer device.

As such, the memory cell 205 may be discharged onto the digit line 215 and the charge transfer device may transfer a charge to a gate of an input transistor of the differential transistor pair from the digit line 215. The charge transferred to the gate of the input transistor may activate (or not activate) the input transistor that is coupled to the sense node of the sense component 245. Subsequently, a signal may be established at the sense node of the sense component 245 based on whether the input transistor is activated or not (e.g., based on the charge transferred to the gate of the input transistor) such that the sense component 245 may determine the logic state stored on the memory cell 205 based on the signal established at the sense node.

The differential transistor pair may isolate the sense node of the sense component 245 from the charge transfer device during various operating steps associated with the charge transfer device (e.g., precharging the charge transfer device to a precharge voltage) during a read operation. Isolating a sense node of the sense component 245 may facilitate using transistors having a relatively low threshold voltages (e.g., low-$V_T$ transistors)—e.g., a sense component 245 may be built with low-$V_T$ transistors—which in turn, may provide an improved threshold voltage matching among transistors for the sense component 245 and reduce power consumption during the read operation.

The local memory controller 260 may control the operation of memory cells 205 through the various components (e.g., row decoder 220, column decoder 225, and sense component 245). The local memory controller 260 may be an example of the local memory controller 165 described with reference to FIG. 1. In some cases, one or more of the row decoder 220, column decoder 225, and sense component 245 may be co-located with the local memory controller 260. The local memory controller 260 may be configured to receive commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations.

The local memory controller 260 may generate row and column address signals to activate the target word line 210 and the target digit line 215. The local memory controller 260 may also generate and control various voltages or currents used during the operation of the memory die 200. In general, the amplitude, shape, or duration of an applied voltage or current discussed herein may be adjusted or varied and may be different for the various operations discussed in operating the memory die 200.

In some cases, the local memory controller 260 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 260 may identify a target memory cell 205 on which to perform the write operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The local memory controller 260 may apply a specific signal (e.g., voltage) to the digit line 215 during the write operation to store a specific state (e.g., charge) in the capacitor 230 of the memory cell 205, the specific state (e.g., charge) may be indicative of a desired logic state.

In some cases, the local memory controller 260 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 260 may identify a target memory cell 205 on which to perform the read operation. The local memory controller 260 may identify a target word line 210 and a target digit line 215 in electronic communication with the target memory cell 205 (e.g., the address of the target memory cell 205).

The local memory controller 260 may activate the target word line 210 and the target digit line 215 (e.g., applying a voltage to the word line 210 or digit line 215), to access the target memory cell 205. The target memory cell 205 may transfer a signal to the sense component 245 in response to biasing the access lines. The sense component 245 may amplify the signal. The local memory controller 260 may fire the sense component 245 (e.g., latch the sense component) and thereby compare the signal received from the memory cell 205 to the reference signal 250. Based on that comparison, the sense component 245 may determine a logic state that is stored on the memory cell 205. The local memory controller 260 may communicate the logic state stored on the memory cell 205 to the external memory controller 105 (or the device memory controller 155) as part of the read operation.

In some memory architectures, accessing the memory cell 205 may degrade or destroy the logic state stored in a memory cell 205. For example, a read operation performed in DRAM architectures may partially or completely discharge the capacitor of the target memory cell. The local memory controller 260 may perform a re-write operation or a refresh operation to return the memory cell to its original logic state. The local memory controller 260 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

In some cases, an apparatus may include a memory cell coupled with a digit line and a sense component including a sense node and a reference node, where the sense component is configured to determine a logic state stored on the memory cell during a read operation. The apparatus may also include a differential transistor pair including an input transistor coupled with the sense node of the sense component and a reference transistor coupled with the reference node of the sense component. Further, the apparatus may include a controller coupled with the memory cell, the sense component, and the differential transistor pair.

In some cases, the controller may precharge a first transistor and a gate of the input transistor of the differential transistor pair to a first precharge voltage and bias a gate of the first transistor to a first voltage based on precharging the first transistor and the gate of the input transistor. The controller may bias the digit line to a second voltage based on discharging the memory cell onto the digit line based on biasing the gate of the first transistor. In some cases, the controller transfers, using the first transistor, a charge between the digit line and the gate of the input transistor based on the second voltage of the digit line being less than the first voltage on the gate of the first transistor. Subsequently, the controller may determine the logic state stored on the memory cell based on transferring the charge between the digit line and the gate of the input transistor.

Figure 3:
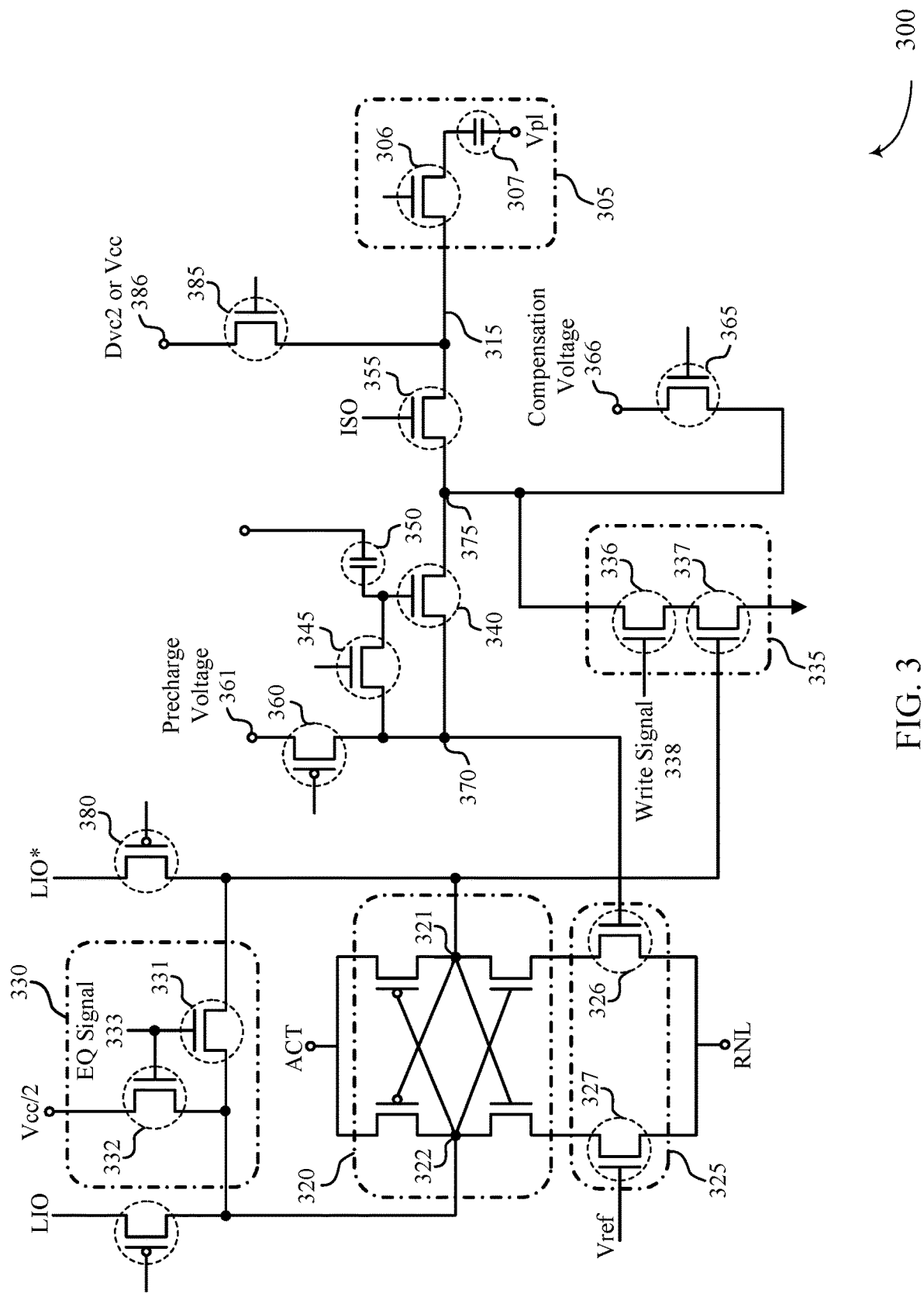
FIG. 3 illustrates an example of a circuit that supports sensing techniques using a charge transfer device in accordance with aspects of the present disclosure.

FIG. 3 illustrates a circuit 300 that supports sensing techniques using a charge transfer device in accordance with aspects of the present disclosure. The circuit 300 illustrates how a differential transistor pair 325 may be coupled with a sense component 320 and other components and circuitry that may accompany such a configuration. The circuit 300 may include one or more components described herein with reference to FIGS. 1 and 2. For example, the circuit 300 may include a memory cell 305, which may be an example of memory cell 205 as described with reference to FIG. 2; a digit line 315, which may be an example of digit line 215 as described with reference to FIG. 2; a sense component 320, which may be an example of sense component 245 as described with reference to FIG. 2; a differential transistor pair 325; an equalization component 330; a write component 335; charge transfer device 340; compensation device 345; gate capacitor 350; and isolation device 355. In some examples, the charge transfer device 340 may be referred to as a first transistor and the compensation device 345 may be referred to as a second transistor. The circuit 300 may also include a third transistor 360 and a fourth transistor 365.

The differential transistor pair 325 may include an input transistor 326 and a reference transistor 327 coupled with the sense component 320. The gate of reference transistor 327 may be coupled with a reference voltage (e.g., Vref). The differential transistor pair 325 may be configured to isolate the sense component 320 (e.g., the sense node 321 of the sense component 320) from some components of the circuit 300 (e.g., the charge transfer device 340 that is coupled with the third transistor 360 at a first node 370) during a read operation. For example, during the read operation, the third transistor 360 may be activated to precharge the first node 370 coupled with the charge transfer device 340. In some examples, the first node 370 may be coupled with the sense node 321 directly. In such cases, precharging the first node 370 may cause some undesirable effects (e.g., unintentional activation of the sense component 320). By coupling the first node with a gate of the input transistor 326, the sense node 321 of the sense component 320 may be isolated from the first node 370 and the likelihood of such undesirable effects may be reduced. In some cases, a voltage at a low-node for a sense component (e.g., RNL node) coupled with the input transistor 326 may be set to maintain the input transistor 326 of the differential transistor pair 325 deactivated while the first node 370 is precharged using the third transistor 360 and a voltage source 361 (e.g., a precharge voltage).

The differential transistor pair 325 may facilitate the sense component 320 to determine a logic state stored in the memory cell 305 during a read operation. For example, as described herein, a charge may be transferred between the digit line 315 and the gate of the input transistor 326 during the read operation. The transferred charge at the gate of the input transistor 326 may develop a voltage at the gate of the input transistor 326 that may be different than a voltage (e.g., a reference voltage) applied to a gate of the reference transistor 327. The difference between the gate voltage of the input transistor 326 and the gate voltage of the reference transistor 327 may facilitate the sense component 320 to establish a signal at the sense node 321. In some cases, a signal opposite to the signal at the sense node 321 may be established at a reference node 322 when the sense component 320 latches.

For example, when a voltage at the gate of the input transistor 326 is greater than a voltage (e.g., a reference voltage) at the gate of the reference transistor 327, the sense node 321 may develop a signal corresponding to a first logic state (e.g., a logic 1). Similarly, when the voltage at the gate of the input transistor 326 is less than the voltage (e.g., the reference voltage) at the gate of the reference transistor 327, the sense node 321 may develop a signal corresponding to a second logic state (e.g., a logic 0). In some cases, a first voltage at the node RNL (e.g., coupled with the input transistor 326 and the reference transistor 327) and a second voltage at a node ACT (e.g., a high-node for a sense component) coupled with the sense component 320 may be determined to ensure a proper operation of the sense component 320 in conjunction with the differential transistor pair 325 during the read operation.

The equalization component 330 may be configured to couple the sense node 321 of the sense component 320 with the reference node 322 of the sense component 320 to provide a common voltage to the sense node 321 and the reference node 322. The common voltage (e.g., Vcc/2) provided by the equalization component 330 to the sense node 321 and the reference node 322 may ensure the sense component 320 is balanced (e.g., initialized by biasing the sense node 321 and the reference node 322 at the common voltage) and prepared to properly latch a signal developed at the sense node 321. The equalization component 330 may include a leveling transistor 331 that couples the sense node 321 of the sense component 320 with the reference node 322 of the sense component 320, where the leveling transistor 331 may be configured to couple the sense node 321 and the reference node 322 with the common voltage (e.g., Vcc/2) when an equalization (EQ) signal 333 is applied to a gate of the leveling transistor 331. The equalization component 330 may also include a biasing transistor 332 that couples the reference node 322 of the sense component 320 with a voltage source (e.g., Vcc/2), where a gate of the biasing transistor 332 may be coupled with the gate of the leveling transistor 331 and the EQ signal 333.

In some cases, the sense component 320 may be balanced (e.g., initialized) using I/O devices coupled with input/output lines (e.g., a first I/O device that may be coupled with a first input/output line associated with LIO signal and a second I/O device that may be coupled with a second input/output line associated with LIO* signal). In such cases, the equalization component 330 may be omitted to decrease a layout area associated with the circuit 300.

The write component 335 may be configured to write a second logic state (e.g., a logic 0) to the memory cell 305. In other words, the write component 335 may provide a current path from the memory cell 305 while the second logic state (e.g., a logic 0) is restored or written at the memory cell 305. As illustrated in the circuit 300, the write component 335 may be coupled with a second node 375 that is coupled with the digit line 315 (hence the memory cell 305 coupled with the digit line 315) through the isolation device 355. The write component 335 may include an enabling transistor 336 coupled with the second node 375, where a gate of the enabling transistor 336 may be coupled with a write signal 338. The write signal 338 may activate the enabling transistor 336 when the write component 335 needs to be activated to restore or write the second logic state to the memory cell 305. The write component 335 may also include an intake transistor 337 coupled with the enabling transistor 336, where a gate of the intake transistor 337 may be coupled with the sense node 321 of the sense component 320. The gate of the intake transistor 337 may also be coupled with a fifth transistor 380. The fifth transistor 380 may be coupled with an input/output line (e.g., LIO* signal associated with the input/output line). In some cases, the enabling transistor 336 and the intake transistor 337 may be switched such that the intake transistor 337 may be coupled with the second node 375 and the enabling transistor 336 may be coupled with the intake transistor 337.

In some cases, the write component 335 may be activated (e.g., the write signal 338 activates the enabling transistor 336) when a read operation is complete to determine a logic state stored in a memory cell (e.g., a memory cell 305) because the logic state may need be restored (or refreshed) at the memory cell. For example, as described herein, the sense node 321 of the sense component 320 may develop a signal corresponding to a second logic state (e.g., a logic 0) when the voltage at the gate of the input transistor 326 is less than the voltage (e.g., the reference voltage) at the gate of the reference transistor 327. The signal at the sense node 321 that is coupled with the gate of the intake transistor 337 may activate the intake transistor 337 to write the second logic state to the memory cell 305—e.g., by providing a path for a current to flow through the write component 335 (e.g., the enabling transistor 336 and the intake transistor 337 are activated), the current restoring the second logic state at the memory cell 305. The isolation device 355 and the switching component 306 of the memory cell 305 may also be activated to access the capacitor 307.

In some cases, the write signal 338 may be applied to the enabling transistor 336 regardless of the logic state being restored or written at the memory cell (e.g., a memory cell 305). In such cases, if a logic state stored in the memory cell is determined to be a second logic state (e.g., a logic 0) based on a signal at the sense node 321, then the intake transistor 337 may be activated to activate the write component 335 (e.g., both the enabling transistor 336 and the intake transistor 337 are activated) to restore or write the second logic state (e.g., a logic 0) at the memory cell. If a logic state stored in the memory cell is determined to be a first logic state (e.g., a logic 1) based on a signal at the sense node 321, then the intake transistor 337 may not be activated such that the write component 335 may remain deactivated despite the enabling transistor 336 being activated based on the write signal 338. In some cases, the memory cell 305 may be written to the first logic state using the sixth transistor 385 and/or the voltage source 386 as soon as the read operation is complete. This may occur to ensure that sufficient time is allotted to write the first logic state.

The third transistor 360 may be coupled with the first node 370 and configured to precharge the first node 370 to a precharge voltage when activated during a read operation. The first node 370 may be further coupled with the charge transfer device 340 and the compensation device 345. The third transistor 360 may be coupled with a voltage source that provides variable precharge voltages to the first node 370. For example, the third transistor 360 may be activated to precharge the first node 370 to a first precharge voltage (e.g., 1 V) during a first duration of the read operation such that a first voltage at a gate of the charge transfer device 340 may be established. Further, the third transistor 360 may be activated to precharge the first node 370 to a second precharge voltage (e.g., 1.6 V) during a second duration of the read operation before transferring a charge between the digit line 315 and the gate of the input transistor 326.

The fourth transistor 365 may be coupled with the second node 375 coupled with the charge transfer device 340. The fourth transistor 365 may be coupled with a voltage source 366 (e.g., a compensation voltage) when activated during a read operation. The fourth transistor 365 may be configured to precharge the second node 375 during a portion of the read operation, during which the gate of the charge transfer device 340 is biased to a first voltage. In some cases, the first voltage at the gate of the charge transfer device 340 may represent a voltage that is the compensation voltage plus the threshold voltage of the charge transfer device 340 (e.g., compensation voltage+$V_T$). Further, the compensation device 345 that is coupled with the gate of the charge transfer device 340 may facilitate biasing the gate of the charge transfer device 340 to the first voltage, where the first voltage may be based on the threshold voltage associated with the charge transfer device 340 plus the voltage applied to the second node 375 during a compensation phase of the read operation (e.g., a precharge voltage of the digit line 315 such as Dvc2 or the compensation voltage). In some cases, statistical process variations (e.g., variations in gate oxide thicknesses, fluctuations in ion-implantation conditions) may contribute to the threshold voltage differential.

The circuit 300 may also include the charge transfer device 340 (e.g., a first transistor) coupled with the gate of the input transistor 326 at the first node 370 and configured to transfer a charge between the digit line 315 (hence the memory cell 305 coupled with the digit line 315) and the gate of the input transistor 326. The circuit 300 may also include the gate capacitor 350 configured to fine tune a voltage at the gate of the charge transfer device 340 and/or to maintain the voltage at the gate of the charge transfer device 340 at a fixed voltage (e.g., at a first voltage). The circuit 300 may also include the isolation device 355 coupled with the second node 375 that may be coupled with the charge transfer device 340. The isolation device 355 may be coupled with the digit line 315 and configured to isolate the second node 375 from the digit line 315 when deactivated during the read operation and couple the second node 375 with the digit line 315 when activated.

Figure 4:
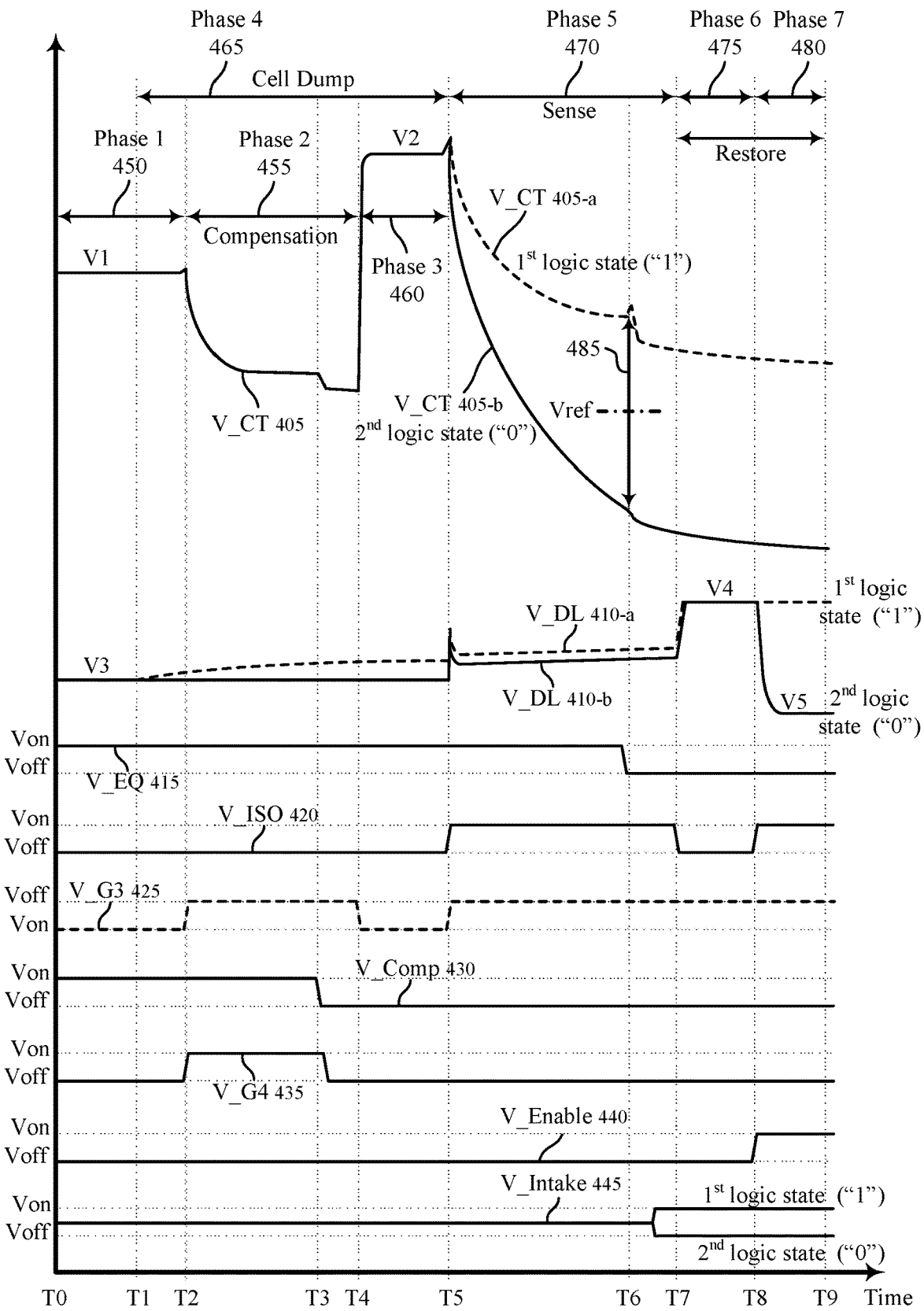
FIG. 4 illustrates an example of a timing diagram that supports sensing techniques using a charge transfer device in accordance with aspects of the present disclosure.

FIG. 4 illustrates a timing diagram 400 that supports sensing techniques using a charge transfer device in accordance with aspects of the present disclosure. The timing diagram 400 illustrates procedures of a read operation to sense a logic state stored on a memory cell. The timing diagram 400 shows various voltage levels (e.g., voltage signals as a function of time) associated with the components and the nodes of the circuit 300 described with reference to FIG. 3 to illustrate how the read operation may be performed. Thus, the timing diagram 400 may illustrate the operation of one or more components described herein with reference to FIGS. 1, 2, and 3. The time and voltage scales used in FIG. 4 are for illustration purposes only and may not necessarily depict particular values in some cases.

The timing diagram 400 includes V_CT 405 (e.g., a voltage of the first node 370 as described with reference to FIG. 3), V_DL 410 (e.g., a voltage associated with the digit line 315 as described with reference to FIG. 3), V_EQ 415 (e.g., a voltage of gates of a leveling transistor 331 and a biasing transistor 332, the voltage associated with an EQ signal 333 as described with reference to FIG. 3), V_G3 425 (e.g., a voltage of a gate of a third transistor 360 as described with reference to FIG. 3), V_Comp 430 (e.g., a control voltage applied to a gate of a compensation device 345 as described with reference to FIG. 3), V_G4 435 (e.g., a voltage of a gate of a fourth transistor 365 as described with reference to FIG. 3), V_Enable 440 (e.g., a voltage of a gate of an enabling transistor 336, the voltage associated with a write signal 338 as described with reference to FIG. 3), and V_Intake 445 (e.g., a voltage of a gate of an intake transistor 337 as described with reference to FIG. 3). As used herein, Von refers to a voltage greater than or equal to a transistor's threshold voltage to activate the transistor. Similarly, Voff refers to a voltage less than a transistor's threshold voltage to deactivate the transistor.

Prior to time T0 (e.g., before precharging the first node 370), the equalization component 330 may be activated to bias the sense node 321 and the reference node 322 to a common voltage (e.g., Vcc/2). Activating the equalization component 330 may include applying the EQ signal 333 to gates of the leveling transistor 331 and the biasing transistor 332 to activate the leveling transistor 331 and the biasing transistor 332 such that both the sense node 321 and the reference node 322 may be biased (e.g., to the common voltage). The EQ signal 333 may remain applied on the gates of the leveling transistor 331 and the biasing transistor 332—e.g., V_EQ 415 corresponds to Von—until time T6. In some cases, the equalization component 330 may be activated in preparation for an access operation (e.g., a read operation).

During the first phase 450 (e.g., phase 1), the third transistor 360 may be activated—e.g., V_G3 425 corresponds to Von to activate the third transistor 360, which is a p-type field-effect transistor (FET)—to precharge the first node 370 (e.g., the charge transfer device 340 and a gate of the input transistor 326, both coupled with the first node 370) to a first precharge voltage—e.g., V_CT 405 precharged to V1 (e.g., 1 V). Also, the isolation device 355 may be deactivated—e.g., V_ISO 420 corresponds to Voff to deactivate the isolation device 355—during the first phase 450 to isolate the charge transfer device 340 from the digit line 315. The digit line 315 may be precharged to a third precharge voltage e.g., V_DL 410 precharged to V3 (e.g., 500 mV)—during the first phase 450. The fourth transistor 365 may be deactivated—e.g., V_G4 435 corresponds to Voff to deactivate the fourth transistor 365 while the first node 370 may be precharged to the first precharge voltage (e.g., V1) during the first phase 450. In addition, the compensation device 345 may be activated—e.g., V_Comp 430 corresponds to Von to activate the compensation device 345 during the first phase 450 to couple the gate of the charge transfer device 340 to the first node 370. The first phase 450 may be referred to as a first precharge duration or a first precharge phase.

During the second phase 455 (e.g., phase 2), the gate of the charge transfer device 340 may be set to a first voltage. The third transistor 360 may be deactivated at time T2 e.g., V_G3 425 corresponds to Voff to deactivate the third transistor 360, based on precharging the first node 370 to the first precharge voltage in some cases. Consequently, V_CT 405 may start to decrease from the first precharge voltage (e.g., V1) at time T2. Also, the isolation device 355 may remain deactivated—e.g., V_ISO 420 remains at Voff—during the second phase 455 to isolate the charge transfer device 340 from the digit line 315. The compensation device 345 may remain activated—e.g., V_Comp 430 remains at Von—until time T3 thereby causing the gate of the charge transfer device 340 to also be biased to V_CT 405. Additionally, the fourth transistor 365 may be activated at time T2—e.g., V_G4 435 switches to Von at time T2 to activate the fourth transistor 365—to provide a constant voltage (e.g., a compensation voltage) to the second node 375. The V_CT 405 may decrease to the first voltage, where the first voltage may be the voltage applied to the second node 375 (e.g., the compensation voltage) and the threshold voltage ($V_T$) of the charge transfer device 340 (e.g., the first voltage may equal the compensation voltage plus $V_T$). Further, the first voltage may be based on a threshold voltage differential associated with the charge transfer device 340.

At time T3, the compensation device 345 may be deactivated—e.g., V_Comp 430 switches to Voff at time T3—thereby isolating the gate of the charge transfer device 340 from the first node 370. Further, the fourth transistor 365 may be deactivated after the compensation device 345 is deactivated at time T3—e.g., V_G4 435 switches to Voff soon after time T3. In some cases, deactivation of the fourth transistor 365 may happen anytime between time T3 and time T4—e.g., V_G4 435 switches to Voff at any time between T3 and T4. The second phase 455 may be referred to as a compensation duration or a compensation phase.

During the third phase 460 (e.g., phase 3), the third transistor 360 may be activated at time T4—e.g., V_G3 425 switches to Von to activate the third transistor 360—to precharge the first node 370 to a second precharge voltage. The second precharge voltage may be in preparation for the charge transfer. V_CT 405 may be precharged to V2 (e.g., 1.6 V) based on biasing the gate of the first transistor to the first voltage. In some cases, transferring a charge (e.g., transferring a charge during the fifth phase 470 as described herein) between the digit line 315 and the gate of the input transistor 326 may be based on precharging the first node 370 to the second precharge voltage (e.g., V2). Also, the isolation device 355 may remain deactivated during the third phase 460—e.g., V_ISO 420 remains at Voff—to isolate the charge transfer device 340 from the digit line 315. The third phase 460 may be referred to as a second precharge duration or a second precharge phase.

During the fourth phase 465 (e.g., phase 4), the memory cell 305 may be coupled with the digit line 315 at time T1 by activating the switching component 306 (e.g., selecting a word line associated with a gate of the switching component 306). V_DL 410 (e.g., V_DL 410 precharged to V3 prior to time T1) may develop a signal based on a logic state stored in the memory cell 305 (e.g., a charge stored in the capacitor 307). In other words, the digit line 315 may be biased to a second voltage based on discharging the memory cell 305 on to the digit line 315. In some cases, a first logic state (e.g., logic 1) stored in the memory cell 305 may cause V_DL 410 to rise from V3 (e.g., V_DL 410-a). In other cases, a second logic state (e.g., logic 0) stored in the memory cell 305 may leave V_DL 410 relatively unchanged from V3 (e.g., V_DL 410-b). In some cases, the shape of voltage associated with the digit line 315 during the fourth phase 465 (e.g., waveform of V_DL 410) may vary based on the third precharge voltage (e.g., V3) used to precharge the digit line 315. Also, the isolation device 355 may remain deactivated during the fourth phase 465—e.g., V_ISO 420 remains at Voff—to isolate the charge transfer device 340 from the digit line 315. In other words, biasing the digit line 315 to the second voltage may be based on deactivating the isolation device 355, in some cases. The fourth phase 465 may be referred to as a cell dump duration or a cell dump phase.

In some cases, the fourth phase 465 may overlap with part of the first phase 450 (e.g., from time T1 to time T2), the second phase 455 (e.g., from time T2 to time T4), and the third phase 460 (e.g., from T4 to time T5) because the isolation device 355 is deactivated e.g., V_ISO 420 remains at Voff to keep the isolation device 355 deactivated—isolates the digit line 315 from the charge transfer device 340 during the first phase 450, the second phase 455, and the third phase 460. In other words, the deactivated isolation device 355 may facilitate concurrent biasing of the digit line 315 (e.g., biasing the digit line 315 to the second voltage during the fourth phase 465, which may have been precharged to V3 (e.g., 500 mV) during the first phase 450), based on discharging the memory cell 305 onto the digit line 315 at time T1.

In some cases, the fourth phase 465 may occur after the second phase 455 is complete. For example, biasing the digit line 315 to a second voltage by discharging the memory cell 305 on to the digit line 315 may be based on biasing the gate of the first transistor to the first voltage. In some cases, the digit line 315 may be used to set the first voltage at the gate of the first transistor instead of using the fourth transistor 365 and the voltage source 366 (e.g., the compensation voltage). In such cases, the sixth transistor 385 may be activated to couple the digit line 315 with the voltage source 386 (e.g., Dvc2). In addition, the isolation device 355 may be activated to couple the digit line 315 (e.g., the digit line 315 coupled with Dvc2) with the second node 375 during a portion of the second phase 455. As such, the first voltage at the gate of the first transistor may represent a voltage that is Dvc2 plus the threshold voltage of the first transistor (e.g., Dvc2+$V_T$).

During the fifth phase 470 (e.g., phase 5), a charge may be transferred between digit line 315 and the first node 370 using the charge transfer device 340. The isolation device 355 may be activated at time T5—e.g., V_ISO 420 switches to Von to activate the isolation device 355—to couple the digit line 315 (e.g., V_DL 410 that has developed a signal corresponding to a logic state stored in the memory cell 305 during the fourth phase 465) with the charge transfer device 340 (e.g., the charge transfer device 340 with its gate biased at the first voltage) at the second node 375. In other words, transferring a charge between the digit line (e.g., the digit line 315 biased to the second voltage that may be representative of or related to a logic state stored in the memory cell 305) and the gate of the input transistor 326 may be based on activating the isolation device 355 at time T5. Also, the third transistor 360 may be deactivated at time T5—e.g., V_G3 425 switches to Voff at time T5 to deactivate the third transistor 360—such that V_CT 405 may start to decrease from the second precharge voltage (e.g., V2). The fifth phase 470 may be referred to as a sense duration or a sense phase.

In some cases, coupling the charge transfer device 340 with the digit line 315 that has been biased by a memory cell 305 storing a first logic state (e.g., logic 1)—e.g., V_DL 410-a depicted with a dotted line, may cause the charge transfer device 340 to be less conductive (e.g., deactivated). In other cases, coupling the charge transfer device 340 with the digit line 315 that has been biased by a memory cell 305 storing a second logic state (e.g., logic 0)—e.g., V_DL 410-b depicted with a solid line, may maintain the charge transfer device 340 as conductive (e.g., activated) as it has been prior to the fifth phase 470. Accordingly, V_CT 405 may exhibit different rates of decrease when the charge transfer device 340 is coupled with the digit line 315 at time T5 based on different logic states stored in the memory cell 305—e.g., V_CT 405-a depicted with a dotted line, V_CT 405-b depicted with a solid line—based on how conductive the charge transfer device 340 may be (e.g., activated or deactivated).

In other words, the charge transfer device 340 may transfer a charge between the digit line 315 and the gate of the input transistor 326 based on a logic state stored in the memory cell 305. In some cases, transferring, using the charge transfer device 340, a charge between the digit line 315 and the gate of the input transistor 326 may be based on the second voltage of the digit line 315 being less than the first voltage on the gate of the charge transfer device 340.

In some cases, more than one sense component (e.g., a sense component 320 described with reference to FIG. 3) may be coupled with a first node 370 (e.g., coupled with a memory cell 305 through a charge transfer device 340 and an isolation device 355). Each sense component may have a same reference voltage (e.g., Vref) in some examples. In such cases, a first sense component may latch at a first time during the fifth phase 470 and a second sense component may latch at second time during the fifth phase 470 after the first time. As V_CT 405 may decrease during the fifth phase 470 based on a logic state stored in the memory cell (e.g., based on how conductive the charge transfer device 340 may be based on the logic state stored in the memory cell), the first sense component and the second sense component may detect different voltages on the first node 370. In other examples, sense component may have different reference voltages (e.g., a first reference voltage for a first sense component, a second reference voltage for a second reference voltage). In such cases, the first sense component and the second sense component may latch at a same time and generate two different outputs based on the two different reference voltages.

The combination of the outputs of the two sense components may detect three or more states stored in the memory cell 305 (e.g., logic states 11, 10, and 00), where the first digit corresponds to the first sense component's latching event with respect to the Vref (or first sense component's output with respect to the first reference voltage) and the second digit corresponds to the second sense component's latching event with respect to the Vref (or second sense component's output with respect to the second reference voltage). As such, three or more distinct states (instead of two distinct states as depicted in FIG. 4) may be determined to be associated with the memory cell and therefore more than one bit of digital data may be stored in the memory cell (e.g., a multi-level cell).

In some cases, a voltage difference in V_CT 405 between the first logic state and the second logic state established during the fifth phase 470 may be referred to as a read window 485. For example, a read window may be on the order of 500 mV. In some cases, a reference voltage (e.g., Vref) may be determined as a voltage near a mid-point of the read window. For example, the reference voltage may be determined to be 600 mV, which may correspond to a voltage near the mid-point of the read window 485 (e.g., a difference in V_CT 405 corresponding to the first logic state and V_CT 405 corresponding to the second logic state).

As described herein, V_CT 405 may represent a voltage at the first node 370 that is coupled with a gate of the input transistor 326 of the differential transistor pair 325 and V_CT 405 may become different from a voltage (e.g., a reference voltage) applied to a gate of the reference transistor 327 during the fifth phase 470. Accordingly, the sense component 320 may establish a signal at the sense node 321 based on the difference between the gate voltage of the input transistor 326 and the gate voltage of the reference transistor 327, where the sense component 320 may be coupled with the differential transistor pair 325. For example, when the voltage at the gate of the input transistor 326 is greater than the voltage (e.g., the reference voltage) at the gate of the reference transistor 327, the sense node 321 may develop a signal corresponding to a first logic state (e.g., a logic 1).

To the contrary, when the voltage at the gate of the input transistor 326 is less than the voltage (e.g., the reference voltage) at the gate of the reference transistor 327, the sense node 321 may develop a signal corresponding to a second logic state (e.g., a logic 0). Hence, a signal (e.g., a signal representative of a logic state stored in the memory cell 305) may be established at the sense node 321 of the sense component 320 based on transferring the charge between the digit line 315 and the gate of the input transistor 326 such that the logic state stored on the memory cell 305 may be determined based on establishing the signal at the sense node 321 of the sense component 320.

In some cases, the sense node 321 may be decoupled from the reference node 322 based on establishing the signal at the sense node 321. Further, decoupling the sense node 321 from the reference node 322 may include deactivating the equalization component 330—e.g., V_EQ 415 switches to Voff prior to time T6—coupled with the sense node 321 and the reference node 322. In some cases, decoupling the sense node 321 from the reference node 322 may be based on the read window 485 becoming sufficiently large with respect to the reference voltage (e.g., Vref). Deactivating the equalization component 330 may include deactivating the leveling transistor 331 of the equalization component 330 by removing the EQ signal 333—e.g., V_EQ 415 switches to Voff—from a gate of the leveling transistor 331 that is coupled with the sense node 321 and the reference node 322. Further, deactivating the equalization component 330 may include deactivating the biasing transistor 332 of the equalization component 330 by removing the EQ signal 333—e.g., V_EQ 415 switches to Voff—from a gate of the biasing transistor 332 that is coupled with the reference node 322 and a voltage source (e.g., Vcc/2).

At time T6, the sense component 320 may latch the signal established at the sense node 321. As described herein, a latching step during a read operation may refer to various transistors or amplifiers of the sense component 320 detecting and amplifying a difference in signals (e.g., the signal at the sense node 321 with respect to the reference node 322). A time duration from time T6 to time T7 may be determined to provide a sufficient time for the transistors or amplifiers of the sense component 320 to detect and amplify the difference in signal to determine the logic state of the memory cell 305 during the latching step. In other words, a logic state stored on the memory cell 305 may be determined based on transferring the charge between the digit line 315 and the gate of the input transistor 326 (e.g., the transferred charge at the gate of the input transistor 326 establishing the signal at the sense node 321). As described herein, the fifth phase 470 may be referred to as a sense duration or a sense phase.

During the sixth phase 475 (e.g., phase 6), the memory cell 305 may store the first logic state (e.g., a logic 1) following the fifth phase 470 (e.g., phase 5, the sense duration during which the logic state of the memory cell may be determined). In some cases, all digit lines (e.g., all memory cells 305 coupled with all digit lines 315) may be biased to a voltage (e.g., V4) corresponding to the first logic state (e.g., a logic 1) during the sixth phase 475. Biasing all the digit lines to V4 at time T7 is accomplished by activating the sixth transistor 385 in addition to setting the voltage source 386 at Vcc. Additionally, the isolation device 355 may be deactivated at time T7—e.g., V_ISO 420 switches to Voff at time T7 to deactivate the isolation device 355 during the sixth phase 475.

During the seventh phase 480 (e.g., phase 7), in some cases, sense components including the second logic state (e.g., a logic 0) may write back to their respective digit lines (e.g., memory cells 305 associated with the respective digit lines)—e.g., biasing the respective digit lines to another voltage (e.g., V5) corresponding to the second logic state. In some cases, the sense components may perform the write back procedure after a precharge command has been detected (e.g., during a row precharge time, which may also be referred to as tRP). In other words, all digit lines (e.g., all memory cells) may be written to the first logic state (e.g., a logic 1) during the sixth phase 475 and a subset of digit lines (e.g., memory cells having been determined to include the second logic state) may be written to the second logic state (e.g., a logic 0) based on detecting a precharge command during the seventh phase 480. As such, a logic state of the memory cell 305 may be restored at the memory cell 305 during the sixth phase 475 and the seventh phase 480. In some cases, the sixth phase 475 and the seventh phase 480 may be referred to as a restore duration or a restore phase.

In some cases, the write component 335 may be activated during the seventh phase 480, where the write component 335 may be coupled with the second node 375 of the charge transfer device 340 and the digit line 315 (e.g., through the isolation device 355). In some cases, activating the write component 335 may include activating the enabling transistor 336 of the write component 335 by applying a write signal (e.g., a write signal 338) to a gate of the enabling transistor 336—e.g., V_Enable 440 switches to Von at time T8, where the enabling transistor 336 may be coupled with the second node 375. Further, activating the write component 335 may include activating the intake transistor 337 of the write component 335—e.g., V_Intake 445 switches to Von or Voff between time T6 and T7 based on the logic that is sensed, where a gate of the intake transistor 337 may be coupled with the sense node 321 of the sense component 320. Additionally, the isolation device 355 may be activated at time T8—e.g., V_ISO 420 switches to Von at time T8 to activate the isolation device 355 during the seventh phase 480.

Figure 5:
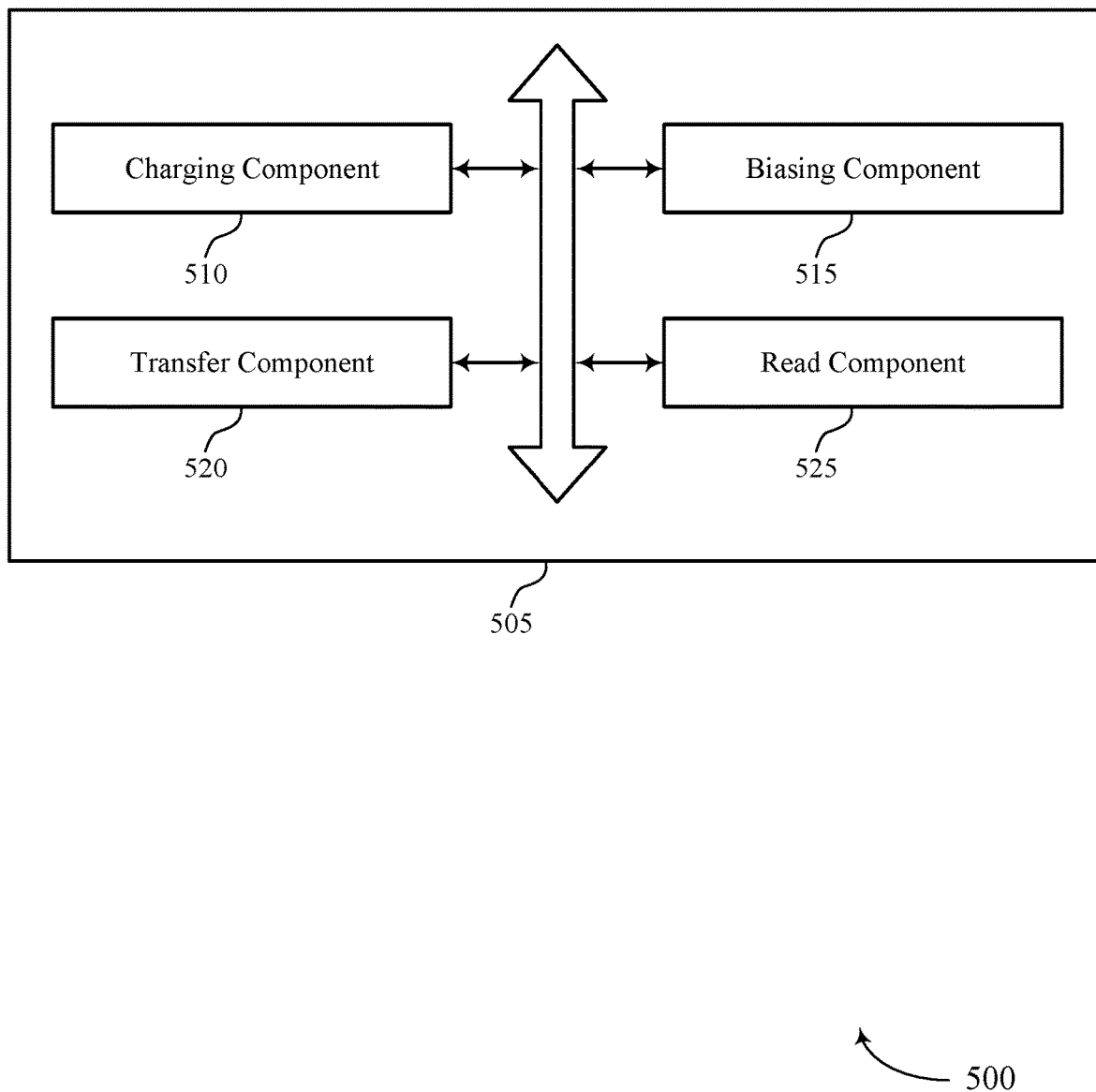
FIG. 5 illustrates an exemplary block diagram of a device that supports sensing techniques using a charge transfer device in accordance with aspects of the present disclosure.

FIG. 5 shows an exemplary block diagram 500 of a device 505 that supports sensing techniques using a charge transfer device in accordance with aspects of the present disclosure. The device 505 may be an example of aspects of a controller (e.g., device memory controller 155, local memory controller 165, local memory controller 260, as described with reference to FIGS. 1 and 2). The device 505 may include a charging component 510, a biasing component 515, a transfer component 520, and a read component 525. Each of these components may communicate, directly or indirectly, with one another (e.g., via one or more buses).

The charging component 510 may precharge a first transistor and a gate of an input transistor to a first precharge voltage. In some cases, the charging component 510 may precharge, based on biasing the gate of the first transistor to the first voltage, a first node to a second precharge voltage by activating a third transistor coupled with the first node, the first node being coupled with the first transistor and the gate of the input transistor, where transferring the charge between the digit line and the gate of the input transistor may be based on precharging the first node to the second precharge voltage.

The biasing component 515 may bias a gate of the first transistor to a first voltage based on precharging the first transistor and the gate of the input transistor. In some cases, the biasing component 515 may bias a digit line to a second voltage based on discharging a memory cell onto the digit line based on biasing the gate of the first transistor. In some cases, the biasing component 515 may activate, before precharging the gate of the input transistor, an equalization component coupled with a sense node of a sense component and a reference node of the sense component.

In some cases, the biasing component 515 may bias the sense node and the reference node of the sense component to a common voltage based on activating the equalization component. In some cases, activating the equalization component may include activating a leveling transistor of the equalization component that is coupled with the sense node and the reference node by applying an equalization signal to a gate of the leveling transistor and activating a biasing transistor of the equalization component that is coupled with the reference node and a voltage source that provides the common voltage by applying the equalization signal to a gate of the biasing transistor.

In some cases, the biasing component 515 may activate a third transistor coupled with a first node, the first node being coupled with the first transistor and the gate of the input transistor, where precharging the gate of the input transistor to the first precharge voltage may be based on activating the third transistor. In some cases, the biasing component 515 may activate, based on determining the logic state stored on the memory cell, a write component coupled with a second node of the first transistor and the digit line through a second transistor. In some cases, activating the write component may include activating an enabling transistor of the write component by applying a write signal to a gate of the enabling transistor, the enabling transistor coupled with the second node and activating an intake transistor of the write component, where a gate of the intake transistor is coupled with a sense node of a sense component.

In some cases, the biasing component 515 may decouple the sense node from a reference node of the sense component based on establishing the signal at the sense node. In some cases, decoupling the sense node from the reference node may include deactivating an equalization component coupled with the sense node and the reference node. In some cases, deactivating the equalization component may include deactivating a leveling transistor of the equalization component by removing an equalization signal from a gate of the leveling transistor that is coupled with the sense node and the reference node and deactivating a biasing transistor of the equalization component by removing the equalization signal from a gate of the biasing transistor that is coupled with the reference node and a voltage source.

In some cases, the biasing component 515 may deactivate a second transistor, the second transistor coupled with a second node of the first transistor and the digit line, where biasing the digit line to the second voltage may be based on deactivating the second transistor. In some cases, the biasing component 515 may activate a second transistor, the second transistor coupled with a second node of the first transistor and the digit line, where transferring the charge between the digit line and the gate of the input transistor may be based on activating the second transistor.

The transfer component 520 may transfer, using the first transistor, a charge between the digit line and the gate of the input transistor based on the second voltage of the digit line being less than the first voltage on the gate of the first transistor.

The read component 525 may determine a logic state stored on the memory cell based on transferring the charge between the digit line and the gate of the input transistor. In some cases, the read component 525 may establish a signal at a sense node of a sense component coupled with the input transistor based on transferring the charge between the digit line and the gate of the input transistor, where determining the logic state stored on the memory cell may be based on establishing the signal at the sense node of the sense component. In some cases, the read component 525 may sense, by a first sense component coupled with the input transistor, a signal at the gate of the input transistor at a first time based on transferring the charge between the digit line and the gate of the input transistor. In some cases, the read component 525 may also sense, by a second sense component coupled with the input transistor, the signal at the gate of the input transistor at a second time different than the first time based on transferring the charge between the digit line and the gate of the input transistor. In some cases, the read component 525 may sense, by a first sense component coupled with the input transistor, a signal at the gate of the input transistor at a time using a first reference value based on transferring the charge between the digit line and the gate of the input transistor. In some cases, the read component 525 may also sense, by a second sense component coupled with the input transistor, the signal at the gate of the input transistor at the time using a second reference value based on transferring the charge between the digit line and the gate of the input transistor.

Figure 6:
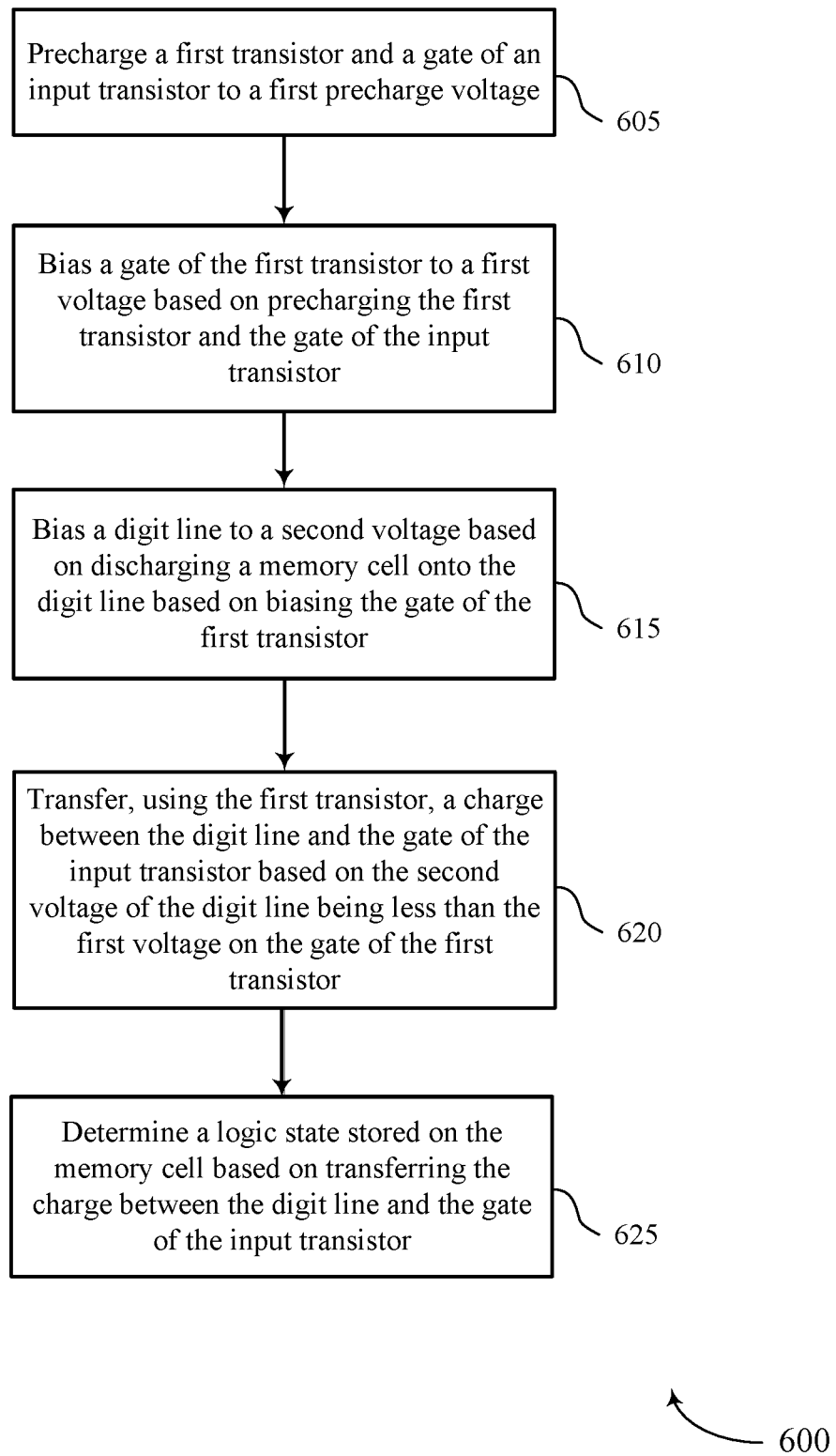
FIGS. 6 and 7 show flowcharts illustrating a method or methods that support sensing techniques using a charge transfer device in accordance with aspects of the present disclosure.

FIG. 6 shows a flowchart illustrating a method 600 that supports sensing techniques using a charge transfer device in accordance with aspects of the present disclosure. The operations of method 600 may be implemented by a controller or its components as described herein. For example, the operations of method 600 may be performed by a controller (e.g., device memory controller 155, local memory controller 165, local memory controller 260, as described with reference to FIGS. 1 and 2). In some examples, a controller may execute a set of instructions to control the functional elements of the memory array to perform the functions described below. Additionally or alternatively, a controller may perform aspects of the functions described below using special-purpose hardware.

At 605 the controller may precharge a first transistor and a gate of an input transistor to a first precharge voltage. In some examples, aspects of the operations of 605 may be performed by a charging component 510 as described with reference to FIG. 5.

At 610 the controller may bias a gate of the first transistor to a first voltage based on precharging the first transistor and the gate of the input transistor. In some examples, aspects of the operations of 610 may be performed by a biasing component 515 as described with reference to FIG. 5.

At 615 the controller may bias a digit line to a second voltage based on discharging a memory cell onto the digit line based on biasing the gate of the first transistor. In some examples, aspects of the operations of 615 may be performed by a biasing component 515 as described with reference to FIG. 5.

At 620 the controller may transfer, using the first transistor, a charge between the digit line and the gate of the input transistor based on the second voltage of the digit line being less than the first voltage on the gate of the first transistor. In some examples, aspects of the operations of 620 may be performed by a transfer component 520 as described with reference to FIG. 5.

At 625 the controller may determine a logic state stored on the memory cell based on transferring the charge between the digit line and the gate of the input transistor. In some examples, aspects of the operations of 625 may be performed by a read component 525 as described with reference to FIG. 5.

An apparatus for performing a method or methods, such as the method 600, is described. The apparatus may include means for precharging a first transistor and a gate of an input transistor to a first precharge voltage, means for biasing a gate of the first transistor to a first voltage based on precharging the first transistor and the gate of the input transistor, means for biasing a digit line to a second voltage based on discharging a memory cell onto the digit line based on biasing the gate of the first transistor, means for transferring, using the first transistor, a charge between the digit line and the gate of the input transistor based on the second voltage of the digit line being less than the first voltage on the gate of the first transistor, and means for determining a logic state stored on the memory cell based on transferring the charge between the digit line and the gate of the input transistor.

Another apparatus for performing a method or methods, such as the method 600, is described. The apparatus may include a memory array and a local memory controller in electronic communication with the memory array, where the local memory controller may be operable to precharge a first transistor and a gate of an input transistor to a first precharge voltage, bias a gate of the first transistor to a first voltage based on precharging the first transistor and the gate of the input transistor, bias a digit line to a second voltage based on discharging a memory cell onto the digit line based on biasing the gate of the first transistor, transfer, using the first transistor, a charge between the digit line and the gate of the input transistor based on the second voltage of the digit line being less than the first voltage on the gate of the first transistor, and determine a logic state stored on the memory cell based on transferring the charge between the digit line and the gate of the input transistor.

Some examples of the method 600 and apparatuses described herein may further include processes, features, means, or instructions for activating, before precharging the gate of the input transistor, an equalization component coupled with a sense node of a sense component and a reference node of the sense component. Some examples of the method 600 and apparatuses described herein may further include processes, features, means, or instructions for biasing the sense node and the reference node of the sense component to a common voltage based on activating the equalization component.

In some examples of the method 600 and apparatuses described herein, activating the equalization component may include activating a leveling transistor of the equalization component that is coupled with the sense node and the reference node by applying an equalization signal to a gate of the leveling transistor and activating a biasing transistor of the equalization component that is coupled with the reference node and a voltage source that provides the common voltage by applying the equalization signal to a gate of the biasing transistor.

Some examples of the method 600 and apparatuses described herein may further include processes, features, means, or instructions for activating a third transistor coupled with a first node, the first node being coupled with the first transistor and the gate of the input transistor, where precharging the gate of the input transistor to the first precharge voltage may be based on activating the third transistor. Some examples of the method 600 and apparatuses described herein may further include processes, features, means, or instructions for precharging, based on biasing the gate of the first transistor to the first voltage, a first node to a second precharge voltage by activating a third transistor coupled with the first node, the first node being coupled with the first transistor and the gate of the input transistor, where transferring the charge between the digit line and the gate of the input transistor may be based on precharging the first node to the second precharge voltage.

Some examples of the method 600 and apparatuses described herein may further include processes, features, means, or instructions for activating, based on determining the logic state stored on the memory cell, a write component coupled with a second node of the first transistor and the digit line through a second transistor. In some examples of the method 600 and apparatuses described herein, activating the write component may include activating an enabling transistor of the write component by applying a write signal to a gate of the enabling transistor, the enabling transistor coupled with the second node and activating an intake transistor of the write component, where a gate of the intake transistor may be coupled with a sense node of a sense component.

Some examples of the method 600 and apparatuses described herein may further include processes, features, means, or instructions for establishing a signal at a sense node of a sense component coupled with the input transistor based on transferring the charge between the digit line and the gate of the input transistor, where determining the logic state stored on the memory cell may be based on establishing the signal at the sense node of the sense component. Some examples of the method 600 and apparatuses described herein may further include processes, features, means, or instructions for decoupling the sense node from a reference node of the sense component based on establishing the signal at the sense node.

In some examples of the method 600 and apparatuses described herein, decoupling the sense node from the reference node may include deactivating an equalization component coupled with the sense node and the reference node. In some examples of the method 600 and apparatuses described herein, deactivating the equalization component may include deactivating a leveling transistor of the equalization component by removing an equalization signal from a gate of the leveling transistor that is coupled with the sense node and the reference node and deactivating a biasing transistor of the equalization component by removing the equalization signal from a gate of the biasing transistor that is coupled with the reference node and a voltage source.

Some examples of the method 600 and apparatuses described herein may further include processes, features, means, or instructions for deactivating a second transistor, the second transistor coupled with a second node of the first transistor and the digit line, where biasing the digit line to the second voltage may be based on deactivating the second transistor. Some examples of the method 600 and apparatuses described herein may further include processes, features, means, or instructions for activating a second transistor, the second transistor coupled with a second node of the first transistor and the digit line, where transferring the charge between the digit line and the gate of the input transistor may be based on activating the second transistor.

Some examples of the method 600 and apparatuses described herein may further include processes, features, means, or instructions for sensing, by a first sense component coupled with the input transistor, a signal at the gate of the input transistor at a first time based on transferring the charge between the digit line and the gate of the input transistor. Some examples of the method 600 and apparatuses described herein may further include processes, features, means, or instructions for sensing, by a second sense component coupled with the input transistor, the signal at the gate of the input transistor at a second time different than the first time based on transferring the charge between the digit line and the gate of the input transistor. Some examples of the method 600 and apparatuses described herein may further include processes, features, means, or instructions for sensing, by a first sense component coupled with the input transistor, a signal at the gate of the input transistor at a time using a first reference value based on transferring the charge between the digit line and the gate of the input transistor. Some examples of the method 600 and apparatuses described herein may further include processes, features, means, or instructions for sensing, by a second sense component coupled with the input transistor, the signal at the gate of the input transistor at the time using a second reference value based on transferring the charge between the digit line and the gate of the input transistor.

Figure 7:
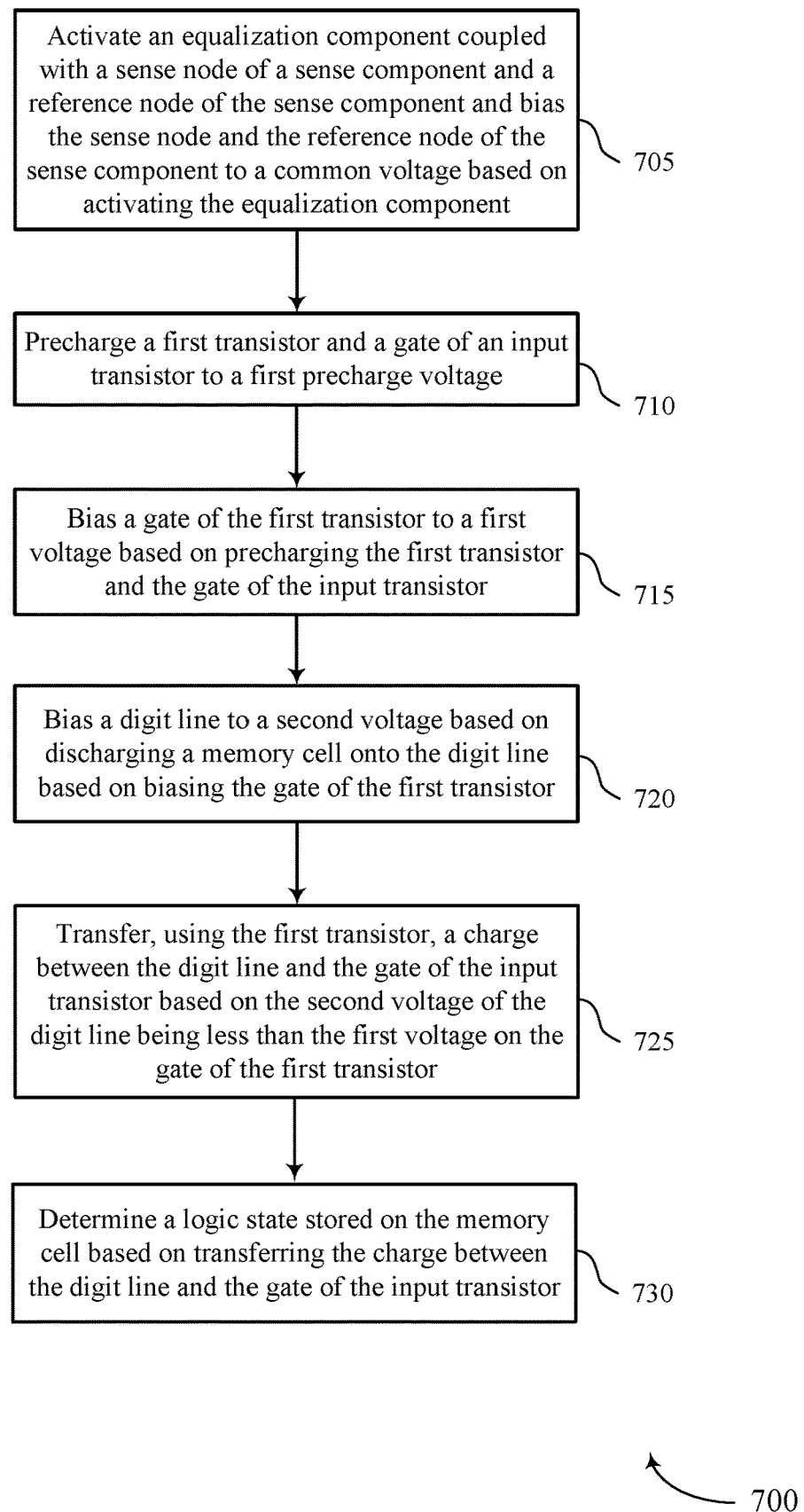

FIG. 7 shows a flowchart illustrating a method 700 that supports sensing techniques using a charge transfer device in accordance with aspects of the present disclosure. The operations of method 700 may be implemented by a controller or its components as described herein. For example, the operations of method 700 may be performed by a controller (e.g., device memory controller 155, local memory controller 165, local memory controller 260, as described with reference to FIGS. 1 and 2). In some examples, a controller may execute a set of instructions to control the functional elements of the memory array to perform the functions described below. Additionally or alternatively, a controller may perform aspects of the functions described below using special-purpose hardware.

At 705 the controller may activate an equalization component coupled with a sense node of a sense component and a reference node of the sense component and bias the sense node and the reference node of the sense component to a common voltage based on activating the equalization component. In some examples, aspects of the operations of 705 may be performed by a biasing component 515 as described with reference to FIG. 5.

At 710 the controller may precharge a first transistor and a gate of an input transistor to a first precharge voltage. In some examples, aspects of the operations of 710 may be performed by a charging component 510 as described with reference to FIG. 5.

At 715 the controller may bias a gate of the first transistor to a first voltage based on precharging the first transistor and the gate of the input transistor. In some examples, aspects of the operations of 715 may be performed by a biasing component 515 as described with reference to FIG. 5.

At 720 the controller may bias a digit line to a second voltage based on discharging a memory cell onto the digit line based on biasing the gate of the first transistor. In some examples, aspects of the operations of 720 may be performed by a biasing component 515 as described with reference to FIG. 5.

At 725 the controller may transfer, using the first transistor, a charge between the digit line and the gate of the input transistor based on the second voltage of the digit line being less than the first voltage on the gate of the first transistor. In some examples, aspects of the operations of 725 may be performed by a transfer component 520 as described with reference to FIG. 5.

At 730 the controller may determine a logic state stored on the memory cell based on transferring the charge between the digit line and the gate of the input transistor. In some examples, aspects of the operations of 730 may be performed by a read component 525 as described with reference to FIG. 5.

An apparatus for performing a method or methods, such as the method 700, is described. The apparatus may include means for activating an equalization component coupled with a sense node of a sense component and a reference node of the sense component, means for biasing the sense node and the reference node of the sense component to a common voltage based on activating the equalization component, means for precharging a first transistor and a gate of an input transistor to a first precharge voltage, means for biasing a gate of the first transistor to a first voltage based on precharging the first transistor and the gate of the input transistor, means for biasing a digit line to a second voltage based on discharging a memory cell onto the digit line based on biasing the gate of the first transistor, means for transferring, using the first transistor, a charge between the digit line and the gate of the input transistor based on the second voltage of the digit line being less than the first voltage on the gate of the first transistor, and means for determining a logic state stored on the memory cell based on transferring the charge between the digit line and the gate of the input transistor.

Another apparatus for performing a method or methods, such as the method 700, is described. The apparatus may include a memory array and a local memory controller in electronic communication with the memory array, where the local memory controller may be operable to activate an equalization component coupled with a sense node of a sense component and a reference node of the sense component, bias the sense node and the reference node of the sense component to a common voltage based on activating the equalization component, precharge a first transistor and a gate of an input transistor to a first precharge voltage, bias a gate of the first transistor to a first voltage based on precharging the first transistor and the gate of the input transistor, bias a digit line to a second voltage based on discharging a memory cell onto the digit line based on biasing the gate of the first transistor, transfer, using the first transistor, a charge between the digit line and the gate of the input transistor based on the second voltage of the digit line being less than the first voltage on the gate of the first transistor, and determine a logic state stored on the memory cell based on transferring the charge between the digit line and the gate of the input transistor.

It should be noted that the methods described above describe possible implementations, and that the operations and the steps may be rearranged or otherwise modified and that other implementations are possible. Furthermore, aspects from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" used herein refers to a stratum or sheet of a geometrical structure. each layer may have three dimensions (e.g., height, width, and depth) and may cover at least a portion of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature.

As used herein, the term "substantially" means that the modified characteristic (e.g., a verb or adjective modified by the term substantially) need not be absolute but is close enough to achieve the advantages of the characteristic.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A device, comprising:
   a memory cell coupled with a digit line;
   a sense component comprising a sense node and a reference node, the sense component configured to determine a logic state stored on the memory cell during a read operation;
   an input transistor coupled with the sense node of the sense component;
   a first transistor coupled with a gate of the input transistor at a first node and configured to transfer a charge between the digit line and the gate of the input transistor; and
   a second transistor coupled with the gate of the input transistor at the first node and configured to bias a gate of the first transistor to a voltage based on a threshold voltage differential associated with the first transistor.

2. The device of claim 1, further comprising:
   an equalization component coupled with the sense node of the sense component with the reference node of the sense component and configured to provide a common voltage to the sense node and the reference node.

3. The device of claim 2, wherein the equalization component comprises:
   a leveling transistor coupling the sense node of the sense component with the reference node of the sense component, wherein the leveling transistor is configured to couple the sense node and the reference node with the common voltage when an equalization signal is applied to a gate of the leveling transistor; and
   a biasing transistor coupling the reference node of the sense component with a voltage source, a gate of the biasing transistor coupled with the gate of the leveling transistor and the equalization signal.

4. The device of claim 1, further comprising:
   a third transistor coupled with the first node and configured to precharge the first node to a precharge voltage when activated during the read operation.

5. The device of claim 4, wherein:
   the third transistor, during a first duration of the read operation, is configured to precharge the first node to a first precharge voltage that biases the gate of the first transistor to the voltage.

6. The device of claim 4, wherein:
   the third transistor, during a second duration of the read operation, is configured to precharge the first node to a second precharge voltage before transferring the charge between the digit line and the gate of the input transistor.

7. The device of claim 1, further comprising:
   a write component coupled with a second node of the first transistor, the second node being coupled with the digit line, wherein the write component is configured to store the logic state to the memory cell.

8. The device of claim 7, wherein the write component comprises:
   an enabling transistor coupled with the second node, wherein a gate of the enabling transistor is coupled with a write signal; and
   an intake transistor coupled with the enabling transistor, wherein a gate of the intake transistor is coupled with the sense node of the sense component.

9. The device of claim 1, further comprising:
   a differential transistor pair configured to isolate the sense component from the first transistor during at least a portion of the read operation, wherein the input transistor is part of the differential transistor pair.

10. The device of claim 1, further comprising:
    a fourth transistor coupled with a second node of the first transistor and a voltage source, the fourth transistor configured to precharge the second node during a portion of the read operation, wherein the gate of the first transistor is biased to the voltage.

11. The device of claim 1, further comprising:
    an isolation transistor coupled with a second node of the first transistor and the digit line and configured to isolate the second node from the digit line when deactivated during the read operation.

12. A method, comprising:
    precharging a first transistor and a gate of an input transistor to a first precharge voltage;
    biasing a gate of the first transistor to a first voltage based at least in part on precharging the first transistor and the gate of the input transistor;
    biasing a digit line to a second voltage based at least in part on discharging a memory cell onto the digit line based at least in part on biasing the gate of the first transistor;
    transferring, using the first transistor, a charge between the digit line and the gate of the input transistor based at least in part on the second voltage of the digit line being less than the first voltage on the gate of the first transistor; and determining a logic state stored on the memory cell based at least in part on transferring the charge between the digit line and the gate of the input transistor.

13. The method of claim 12, further comprising:
activating, before precharging the gate of the input transistor, an equalization component coupled with a sense node of a sense component and a reference node of the sense component; and
biasing the sense node and the reference node of the sense component to a common voltage based at least in part on activating the equalization component.

14. The method of claim 13, wherein activating the equalization component comprises:
activating a leveling transistor of the equalization component that is coupled with the sense node and the reference node by applying an equalization signal to a gate of the leveling transistor; and
activating a biasing transistor of the equalization component that is coupled with the reference node and a voltage source that provides the common voltage by applying the equalization signal to a gate of the biasing transistor.

15. The method of claim 12, further comprising:
activating a third transistor coupled with a first node, the first node being coupled with the first transistor and the gate of the input transistor, wherein precharging the gate of the input transistor to the first precharge voltage is based at least in part on activating the third transistor.

16. The method of claim 12, further comprising:
precharging, based at least in part on biasing the gate of the first transistor to the first voltage, a first node to a second precharge voltage by activating a third transistor coupled with the first node, the first node being coupled with the first transistor and the gate of the input transistor, wherein transferring the charge between the digit line and the gate of the input transistor is based at least in part on precharging the first node to the second precharge voltage.

17. The method of claim 12, further comprising:
activating, based at least in part on determining the logic state stored on the memory cell, a write component coupled with a second node of the first transistor and the digit line through a second transistor, wherein activating the write component comprises:
activating an enabling transistor of the write component by applying a write signal to a gate of the enabling transistor, the enabling transistor coupled with the second node; and
activating an intake transistor of the write component, wherein a gate of the intake transistor is coupled with a sense node of a sense component.

18. The method of claim 12, further comprising:
establishing a signal at a sense node of a sense component coupled with the input transistor based at least in part on transferring the charge between the digit line and the gate of the input transistor, wherein determining the logic state stored on the memory cell is based at least in part on establishing the signal at the sense node of the sense component.

19. The method of claim 18, further comprising:
decoupling the sense node from a reference node of the sense component based at least in part on establishing the signal at the sense node.

20. The method of claim 19, further comprising:
deactivating a leveling transistor of an equalization component by removing an equalization signal from a gate of the leveling transistor that is coupled with the sense node and the reference node; and
deactivating a biasing transistor of the equalization component by removing the equalization signal from a gate of the biasing transistor that is coupled with the reference node and a voltage source.

21. The method of claim 12, further comprising:
deactivating a second transistor, the second transistor coupled with a second node of the first transistor and the digit line, wherein biasing the digit line to the second voltage is based at least in part on deactivating the second transistor.

22. The method of claim 12, further comprising:
activating a second transistor, the second transistor coupled with a second node of the first transistor and the digit line, wherein transferring the charge between the digit line and the gate of the input transistor is based at least in part on activating the second transistor.

23. The method of claim 12, further comprising:
sensing, by a first sense component coupled with the input transistor, a signal at the gate of the input transistor at a first time based at least in part on transferring the charge between the digit line and the gate of the input transistor; and
sensing, by a second sense component coupled with the input transistor, the signal at the gate of the input transistor at a second time different than the first time based at least in part on transferring the charge between the digit line and the gate of the input transistor.

24. The method of claim 12, further comprising:
sensing, by a first sense component coupled with the input transistor, a signal at the gate of the input transistor at a time using a first reference value based at least in part on transferring the charge between the digit line and the gate of the input transistor; and
sensing, by a second sense component coupled with the input transistor, the signal at the gate of the input transistor at the time using a second reference value based at least in part on transferring the charge between the digit line and the gate of the input transistor.

25. An apparatus, comprising:
a memory cell coupled with a digit line;
a sense component comprising a sense node and a reference node, the sense component configured to determine a logic state stored on the memory cell during a read operation;
a differential transistor pair comprising an input transistor coupled with the sense node of the sense component and a reference transistor coupled with the reference node of the sense component; and
a controller coupled with the memory cell, the sense component, and the differential transistor pair, the controller configured to:
precharge a first transistor and a gate of the input transistor of the differential transistor pair to a first precharge voltage;
bias a gate of the first transistor to a first voltage based at least in part on precharging the first transistor and the gate of the input transistor;
bias the digit line to a second voltage based at least in part on discharging the memory cell onto the digit line based at least in part on biasing the gate of the first transistor;
transfer, using the first transistor, a charge between the digit line and the gate of the input transistor based at least in part on the second voltage of the digit line being less than the first voltage on the gate of the first transistor; and determine the logic state stored on the memory cell based at least in part on transferring the charge between the digit line and the gate of the input transistor.

* * * * *